United States Patent
Champlin

(10) Patent No.: US 6,313,607 B1
(45) Date of Patent: *Nov. 6, 2001

(54) METHOD AND APPARATUS FOR EVALUATING STORED CHARGE IN AN ELECTROCHEMICAL CELL OR BATTERY

(76) Inventor: Keith S. Champlin, 5437 Elliot Ave. South, Minneapolis, MN (US) 55417

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/388,501

(22) Filed: Sep. 1, 1999

(51) Int. Cl.[7] ........................................ H02J 7/00

(52) U.S. Cl. .......................................... 320/132; 320/130

(58) Field of Search ...................... 320/132, 130, 320/134; 324/430, 436

(56) References Cited

U.S. PATENT DOCUMENTS

| | | | |
|---|---|---|---|
| 2,514,745 | 7/1950 | Dalzell | 324/115 |
| 3,356,936 | 12/1967 | Smith | 324/429 |
| 3,562,634 | 2/1971 | Latner | 324/427 |

(List continued on next page.)

FOREIGN PATENT DOCUMENTS

| | | |
|---|---|---|
| 0 022 450 A1 | 1/1981 | (EP) . |
| 29 26 716 B1 | 1/1981 | (DE) . |
| 0 637 754 A1 | 2/1995 | (EP) . |
| 0 772 056 A1 | 5/1997 | (EP) . |
| 2 749 397 | 12/1997 | (FR) . |
| 2 088 159 | 6/1982 | (GB) . |
| 59-017894 | 1/1984 | (JP) . |
| 59-17892 | 1/1984 | (JP) . |
| 59-17893 | 1/1984 | (JP) . |
| 59-17894 | 1/1984 | (JP) . |
| 59-125674 | 12/1984 | (JP) . |
| 60-225078 | 11/1985 | (JP) . |
| 62-180284 | 8/1987 | (JP) . |
| 03274479 | 12/1991 | (JP) . |
| 03282276 | 12/1991 | (JP) . |
| 04131779 | 5/1992 | (JP) . |
| 04372536 | 12/1992 | (JP) . |
| 5216550 | 8/1993 | (JP) . |
| 7-128414 | 5/1995 | (JP) . |
| WO 93/22666 | 11/1993 | (WO) . |
| WO 98/58270 | 12/1998 | (WO) . |

OTHER PUBLICATIONS

"Electrochemical Impedance Spectroscopy in Battery Development and Testing", *Batteries International*, Apr. 1997, pp. 59 and 62–63.

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

"A Look at the Impedance of a Cell", by S. Debardelaben, *IEEE*, 1988, pp. 394–397.

(List continued on next page.)

Primary Examiner—Peter S. Wong
Assistant Examiner—Lawrence Luk

(57) ABSTRACT

A testing device applies time-varying electrical excitation to a cell or battery and senses the resulting time-varying electrical response. Computation circuitry within the device uses voltage and current signals derived from the excitation and response signals as inputs and computes values of elements of an equivalent circuit representation of the cell or battery. The relative charge SOC) of the cell or battery is calculated from the value of the conductance component G of a particular parallel G-C subcircuit of the equivalent circuit. The absolute charge (Ah) contained in the cell or battery is calculated from the value of the capacitance component C of a different parallel G-C subcircuit. Relative or absolute charge values are then either displayed to the user or are used to control an external process such as charging of the battery.

19 Claims, 2 Drawing Sheets

U.S. PATENT DOCUMENTS

| | | | |
|---|---|---|---|
| 3,593,099 | 7/1971 | Scholl | 320/127 |
| 3,607,673 | 9/1971 | Seyl | 324/425 |
| 3,676,770 | 7/1972 | Sharaf et al. | 324/430 |
| 3,729,989 | 5/1973 | Little | 324/162 |
| 3,753,094 | 8/1973 | Furuishi et al. | 324/430 |
| 3,808,522 | 4/1974 | Sharaf | 324/430 |
| 3,811,089 | 5/1974 | Strezelewicz | 324/170 |
| 3,873,911 | 3/1975 | Champlin | 324/430 |
| 3,886,443 | 5/1975 | Miyakawa et al. | 324/426 |
| 3,889,248 | 6/1975 | Ritter | 340/636 |
| 3,906,329 | 9/1975 | Bader | 320/134 |
| 3,909,708 | 9/1975 | Champlin | 324/431 |
| 3,936,744 | 2/1976 | Perlmutter | 324/772 |
| 3,946,299 | 3/1976 | Christianson et al. | 320/430 |
| 3,947,757 | 3/1976 | Grube et al. | 324/416 |
| 3,969,667 | 7/1976 | McWilliams | 324/427 |
| 3,979,664 | 9/1976 | Harris | 324/397 |
| 3,984,762 | 10/1976 | Dowgiallo, Jr. | 324/430 |
| 3,984,768 | 10/1976 | Staples | 324/712 |
| 3,989,544 | 11/1976 | Santo | 429/65 |
| 4,008,619 | 2/1977 | Alcaide et al. | 73/724 |
| 4,053,824 | 10/1977 | Dupuis et al. | 324/434 |
| 4,070,624 | 1/1978 | Taylor | 327/772 |
| 4,086,531 | 4/1978 | Bernier | 324/772 |
| 4,112,351 | 9/1978 | Back et al. | 324/380 |
| 4,114,083 | 9/1978 | Benham et al. | 320/150 |
| 4,126,874 | 11/1978 | Suzuki et al. | 324/429 |
| 4,178,546 | 12/1979 | Hulls et al. | 324/772 |
| 4,193,025 | 3/1980 | Frailing et al. | 324/427 |
| 4,207,611 | 6/1980 | Gordon | 324/503 |
| 4,315,204 | 2/1982 | Sievers et al. | 322/28 |
| 4,316,185 | 2/1982 | Watrous et al. | 340/636 |
| 4,322,685 | 3/1982 | Frailing et al. | 324/429 |
| 4,363,407 | 12/1982 | Barkler et al. | 209/3.3 |
| 4,369,407 | 1/1983 | Korbell | 324/416 |
| 4,379,990 | 4/1983 | Sievers et al. | 322/99 |
| 4,390,828 | 6/1983 | Converse et al. | 320/153 |
| 4,392,101 | 7/1983 | Saar et al. | 320/156 |
| 4,396,880 | 8/1983 | Windebank | 320/156 |
| 4,408,157 | 10/1983 | Beaubien | 324/712 |
| 4,412,169 | 10/1983 | Dell'Orto | 320/123 |
| 4,423,378 | 12/1983 | Marino et al. | 324/427 |
| 4,423,379 | 12/1983 | Jacobs et al. | 324/429 |
| 4,424,491 | 1/1984 | Bobbett et al. | 324/433 |
| 4,459,548 | 7/1984 | Lentz et al. | 324/772 |
| 4,514,694 | 4/1985 | Finger | 324/429 |
| 4,520,353 | 5/1985 | McAuliffe | 340/636 |
| 4,667,279 | 5/1987 | Maier | 363/46 |
| 4,678,998 | 7/1987 | Muramatsu | 324/427 |
| 4,679,000 | 7/1987 | Clark | 324/428 |
| 4,697,134 | 9/1987 | Burkum et al. | 320/134 |
| 4,707,795 | 11/1987 | Alber et al. | 320/150 |
| 4,709,202 | 11/1987 | Koenck et al. | 320/112 |
| 4,710,861 | 12/1987 | Kanner | 363/46 |
| 4,719,428 | 1/1988 | Liebermann | 324/436 |
| 4,743,855 | 5/1988 | Randin et al. | 324/430 |
| 4,745,349 | 5/1988 | Palanisamy et al. | 320/125 |
| 4,816,768 | 3/1989 | Champlin | 324/428 |
| 4,820,966 | 4/1989 | Fridman | 320/116 |
| 4,825,170 | 4/1989 | Champlin | 324/436 |
| 4,849,700 | 7/1989 | Morioka et al. | 324/427 |
| 4,876,495 | 10/1989 | Palanisamy et al. | 320/106 |
| 4,881,038 | 11/1989 | Champlin | 324/426 |
| 4,912,416 | 3/1990 | Champlin | 324/430 |
| 4,929,931 | 5/1990 | McCuen | 340/636 |
| 4,931,738 | 6/1990 | MacIntyre et al. | 324/435 |
| 4,937,528 | 6/1990 | Palanisamy et al. | 324/430 |
| 4,947,124 | 8/1990 | Hauser | 324/430 |
| 4,956,597 | 9/1990 | Heavvvvey et al. | 320/129 |
| 4,968,941 | 11/1990 | Rogers | 324/428 |
| 5,004,979 | 4/1991 | Marino et al. | 324/160 |
| 5,032,825 | 7/1991 | Xuznicki | 340/636 |
| 5,047,722 | 9/1991 | Wurst et al. | 324/430 |
| 5,087,881 | 2/1992 | Peacock | 324/378 |
| 5,126,675 | 6/1992 | Yang | 324/435 |
| 5,140,269 | 8/1992 | Champlin | 324/433 |
| 5,144,218 * | 9/1992 | Bosscha | 320/139 |
| 5,144,248 | 9/1992 | Alexandres et al. | 324/428 |
| 5,170,124 | 12/1992 | Blair et al. | 324/434 |
| 5,179,335 | 1/1993 | Nor | 320/159 |
| 5,204,611 | 4/1993 | Nor et al. | 320/145 |
| 5,214,370 | 5/1993 | Harm et al. | 320/152 |
| 5,214,385 | 5/1993 | Gabriel et al. | 324/434 |
| 5,241,275 | 8/1993 | Fang | 324/430 |
| 5,254,952 | 10/1993 | Salley et al. | 324/429 |
| 5,266,880 | 11/1993 | Newland | 320/125 |
| 5,281,919 | 1/1994 | Palanisamy | 324/427 |
| 5,281,920 | 1/1994 | Wurst | 324/430 |
| 5,295,078 | 3/1994 | Stich et al. | 320/136 |
| 5,298,797 | 3/1994 | Redl | 327/387 |
| 5,300,874 | 4/1994 | Shimamoto et al. | 320/106 |
| 5,302,902 | 4/1994 | Groehl | 324/434 |
| 5,315,287 | 5/1994 | Sol | 340/455 |
| 5,331,268 | 7/1994 | Patino et al. | 320/158 |
| 5,336,993 | 8/1994 | Thomas et al. | 324/158.1 |
| 5,343,380 | 8/1994 | Champlin | 363/46 |
| 5,352,968 | 10/1994 | Reni et al. | 320/136 |
| 5,365,160 | 11/1994 | Leppo et al. | 320/160 |
| 5,365,453 | 11/1994 | Startup et al. | 320/136 |
| 5,381,096 | 1/1995 | Hirzel | 324/427 |
| 5,426,371 | 6/1995 | Salley et al. | 324/429 |
| 5,432,426 | 7/1995 | Yoshida | 320/160 |
| 5,434,495 | 7/1995 | Toko | 320/135 |
| 5,442,274 | 8/1995 | Tamai | 320/146 |
| 5,449,996 | 9/1995 | Matsumoto et al. | 320/148 |
| 5,449,997 | 9/1995 | Gilmore et al. | 320/148 |
| 5,451,881 | 9/1995 | Finger | 324/433 |
| 5,457,377 | 10/1995 | Jonsson | 324/430 |
| 5,469,043 | 11/1995 | Cherng et al. | 320/31 |
| 5,485,090 | 1/1996 | Stephens | 324/433 |
| 5,488,300 | 1/1996 | Jamieson | 324/432 |
| 5,519,383 | 5/1996 | De La Rosa | 340/636 |
| 5,528,148 | 6/1996 | Rogers | 320/137 |
| 5,546,317 | 8/1996 | Andrieu | 364/481 |
| 5,550,485 | 8/1996 | Falk | 324/772 |
| 5,561,380 | 10/1996 | Sway-Tin et al. | 324/509 |
| 5,562,501 | 10/1996 | Kinoshita et al. | 439/852 |
| 5,572,136 | 11/1996 | Champlin | 324/426 |
| 5,574,355 * | 11/1996 | McShane et al. | 320/161 |
| 5,583,416 | 12/1996 | Klang | 320/160 |
| 5,585,728 | 12/1996 | Champlin | 324/427 |
| 5,592,093 | 1/1997 | Klingbiel | 324/426 |
| 5,596,260 | 1/1997 | Moravec et al. | 320/135 |
| 5,598,098 | 1/1997 | Champlin | 324/430 |
| 5,602,462 | 2/1997 | Stich et al. | 323/258 |
| 5,606,242 | 2/1997 | Hull et al. | 320/106 |
| 5,621,298 | 4/1997 | Harvey | 320/134 |
| 5,642,031 | 6/1997 | Brotto | 320/156 |
| 5,650,937 | 7/1997 | Bounaga | 324/426 |
| 5,652,501 | 7/1997 | McClure et al. | 320/636 |
| 5,675,234 | 10/1997 | Greene | 320/636 |
| 5,677,077 | 10/1997 | Faulk | 429/90 |
| 5,699,050 | 12/1997 | Kanazawa | 340/636 |
| 5,701,089 | 12/1997 | Perkins | 327/772 |
| 5,705,929 | 1/1998 | Caravello et al. | 324/430 |
| 5,710,503 | 1/1998 | Sideris et al. | 320/116 |
| 5,717,336 | 2/1998 | Basell et al. | 324/430 |
| 5,717,937 | 2/1998 | Fritz | 320/128 |
| 5,757,192 | 5/1998 | McShane et al. | 324/427 |
| 5,760,587 | 6/1998 | Harvey | 324/434 |
| 5,773,978 | 6/1998 | Becker | 324/430 |

| | | | |
|---|---|---|---|
| 5,789,899 | 8/1998 | van Phuoc et al. | 320/112 |
| 5,793,359 | 8/1998 | Ushikubo | 345/169 |
| 5,808,469 | 9/1998 | Harvey | 324/434 |
| 5,821,756 | 10/1998 | McShane et al. | 324/430 |
| 5,831,435 | 11/1998 | Troy | 324/426 |
| 5,862,515 | 1/1999 | Kobayshi et al. | 702/63 |
| 5,872,443 | 2/1999 | Williamson | 320/160 |
| 5,914,605 | 6/1999 | Bertness | 324/430 |
| 5,929,609 | 7/1999 | Joy et al. | 322/25 |
| 5,945,829 | 8/1999 | Bertness | 324/430 |
| 6,002,238 | 12/1999 | Champlin | 320/134 |
| 6,008,652 | 12/1999 | Boisvert et al. | 701/99 |
| 6,031,354 | 2/2000 | Wiley et al. | 320/116 |
| 6,037,751 | 3/2000 | Klang | 320/160 |
| 6,037,777 | 3/2000 | Champlin | 324/430 |
| 6,051,976 | 4/2000 | Bertness | 324/426 |
| 6,072,299 | 6/2000 | Kurie et al. | 320/112 |
| 6,072,300 | 6/2000 | Bertness et al. | 320/134 |
| 6,081,098 | 6/2000 | Bertness | 324/426 |
| 6,094,033 * | 7/2000 | Ding et al. | 320/132 |
| 6,104,167 | 8/2000 | Bertness et al. | 320/132 |
| 6,137,269 | 10/2000 | Champlin | 320/150 |
| 6,163,156 | 12/2000 | Ding et al. | 320/132 |
| 6,172,483 | 1/2001 | Champlin | 320/134 |
| 6,172,505 | 1/2001 | Bertness | 324/430 |
| 9,503,015 | 2/2000 | Champlin | 320/134 |
| 9,710,031 | 11/2000 | Champlin | 320/134 |

OTHER PUBLICATIONS

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

IEEE Recommended Practice For Maintenance, Testings, and Replacement of Large Lead Storage Batteries for Generating Stations and Substations, *The Institute of Electrical and Electronics Engineers, Inc.*, ANSI/IEEE Std. 450–1987, Mar. 9, 1987, pp. 7–15.

"Field and Laboratory Studies to Assess the State of Health of Valve–Regulated Lead Acid Batteries: Part I Conductace/Capacity Correlation Studies", by D. Feder et al., *IEEE*, Aug. 1992, pp. 218–233.

"Battery Impedance", by E. Willihnganz et al., *Electrical Engineering*, Sep. 1959, pp. 922–925.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

Internal Resistance: Harbinger of Capacity Loss in Starved Electrolyte Sealed Lead Acid Batteries, by Vaccaro, F. J. et al., *AT&T Bell Laboratories*, 1987 IEEE, Ch. 2477, pp. 128, 131.

* cited by examiner $Y3 = G3 + j\omega C3$ $Y2 = G2 + j\omega C2$

METHOD AND APPARATUS FOR EVALUATING STORED CHARGE IN AN ELECTROCHEMICAL CELL OR BATTERY

BACKGROUND OF THE INVENTION

The present invention relates to testing of storage batteries. More specifically, the invention relates to evaluating stored charge in an electrochemical cell or battery.

Stored charge is an important parameter in many applications of electrochemical cells and batteries. With traction batteries, stored charge represents an electric vehicle's fuel supply and thus determines how far the vehicle can travel before recharging. With stationary standby batteries, the level of stored charge determines how long a critical load can continue to function in the event of a power failure or disconnection from the ac mains. In automotive applications, stored charge determines the length of time that the lights and accessories can be operated when the engine is off, or when the charging system has malfunctioned.

With lead-acid batteries, relative stored charge, or state-of-charge (SOC), has been traditionally evaluated by observing either the battery's open-circuit voltage, or the specific gravity of the battery's electrolyte. However, neither of these measurements yields an absolute determination of the amount of stored charge. Furthermore, specific gravity measurements are messy and altogether impossible to perform on sealed lead-acid cells; and open-circuit voltage is difficult to determine under load conditions, and is imprecisely related to SOC since it is greatly affected by both "surface charge" and temperature.

Because of these problems, several techniques for correcting the voltage of lead-acid batteries to obtain SOC have been proposed. These include the techniques described by Christianson et al. in U.S. Pat. No. 3,946,299, by Reni et al. in U.S. Pat. No. 5,352,968, and by Hirzel in U.S. Pat. No. 5,381,096. However, such voltage correction methods are not very accurate. Furthermore, with electrochemical systems other than lead-acid, they may be of little help since battery voltage often bears very little relationship to stored charge.

Because of the problems with traditional methods for determining relative charge (SOC), many techniques based upon measuring ac impedance have been suggested. For example, U.S. Pat. No. 3,984,762 to Dowgiallo purports to determine SOC directly from the phase angle of the complex impedance at a single frequency. In U.S. Pat. No. 4,743,855, Randin et al. assert that SOC can be determined from the argument (i.e., phase angle) of the difference between complex impedances measured at two different frequencies. Bounaga, in U.S. Pat. No. 5,650,937, reportedly determines SOC from measurements of the imaginary part of the complex impedance at a single frequency. Finally, Basell et al., in U.S. Pat. No. 5,717,336 purport to determine SOC from the rate of change of impedance with frequency at low frequency. However, the fact that none of these ac impedance methods has gained wide acceptance suggests that they may not be altogether satisfactory methods for determining SOC.

The absolute stored charge or amp-hour capacity of batteries has been traditionally measured by timed-discharge tests. However, because of the expense and the time involved in performing such tests, ac techniques for determining amp-hour capacity have been proposed. Sharaf, in U.S. Pat. No. 3,808,522, teaches a method for determining the capacity of a lead-acid battery from measurements of its ac internal resistance. Yang, in U.S. Pat. No. 5,126,675, also uses measurements of internal resistance to determine battery capacity. Muramatsu reports, in U.S. Pat. No. 4,678,998, that he can determine both the remaining amp-hour capacity and the remaining service life of a battery from measurements of the ac impedance magnitude at two different frequencies. Fang, in U.S. Pat. No. 5,241,275, teaches a method for determining remaining capacity from complex impedance measured at two or three frequencies in the range from 0.001 to 1.0 Hz. Finally, Champlin, in U.S. Pat. No. 5,140,269, has shown that percent capacity can be determined from the measured dynamic conductance at a single frequency if the dynamic conductance of a reference, fully-charged, identically constructed, new battery is known. This method, although quite accurate, requires that aprioi data be available.

SUMMARY OF THE INVENTION

A testing device applies time-varying electrical excitation to a cell or battery and senses the resulting time-varying electrical response. Computation circuitry within the device uses voltage and current signals derived from the excitation and response signals as inputs and computes values of elements of an equivalent circuit representation of the cell or battery. In one aspect, the relative charge (SOC) of the cell or battery is calculated from the value of the conductance component G of a particular parallel G-C subcircuit of the equivalent circuit. In another, the absolute charge (Ah) contained in the cell or battery is calculated from the value of the capacitance component C of a different parallel G-C subcircuit. In other aspects, relative or absolute charge values are then either displayed to the user or are used to control an external process such as charging of the battery.

DETAILED DESCRIPTION OF THE PREFERRED EMBODIMENTS

A method and apparatus for quickly and accurately determining both relative charge (SOC) and absolute charge (Ah)

that is unaffected by "surface charge" and does not require apriori data would be of great value. The present invention addresses this need. It is based upon teachings disclosed in U.S. Pat. No. 6,002,238 issued Dec. 14, 1999 and entitled "METHOD AND APPARATUS FOR MEASURING COMPLEX IMPEDANCE OF CELLS AND BATTERIES" and U.S. Pat. No. 6,037,777, issued Mar. 14, 2000, entitled "METHOD AND APPARATUS FOR DETERMINING BATTERY PROPERTIES FROM COMPLEX IMPEDANCE ADMITTANCE" which are incorporated herein by reference.

Figure 1:
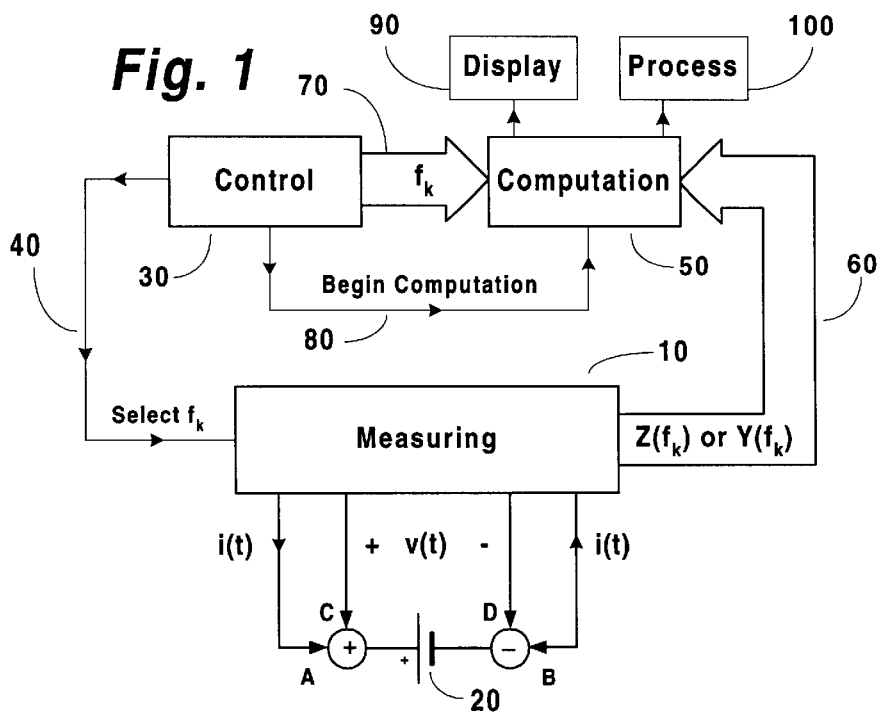
FIG. 1 is a block diagram of a device for evaluating stored charge in an electrochemical cell or battery according to the present invention.

FIG. 1 discloses a block diagram of apparatus for evaluating stored charge according to the present invention. Apparatus of this type is fully disclosed in U.S. Pat. No. 6,002,238 and U.S. Pat. No. 6,037,777. Measuring circuitry 10 electrically couples to cell/battery 20 by means of current-carrying contacts A and B and voltage-sensing contacts C and D. Measuring circuitry 10 passes a periodic time-varying current i(t) through contacts A and B and senses a periodic time-varying voltage v(t) across contacts C and D. By appropriately processing and combining i(t) and v(t), measuring circuitry 10 determines real and imaginary parts of a complex parameter, either impedance Z or admittance Y, at a measuring frequency $f_k$; where $f_k$ is a discrete frequency contained in the periodic waveforms of both i(t) and v(t).

Control circuitry 30 couples to measuring circuitry 10 via command path 40 and commands measuring circuitry 10 to determine the complex parameter of cell/battery 20 at each one of n discrete measuring frequencies, where n is an integer number. This action defines 3n experimental quantities: the values of the n measuring frequencies and the values of the n imaginary parts and n real parts of the complex parameter at the n measuring frequencies.

Computation circuitry 50 couples to measuring circuitry 10 and to control circuitry 30 via data paths 60 and 70, respectively, and accepts the 2n experimental values from measuring circuitry 10 and the values of the n measuring frequencies from control circuitry 30. Upon a "Begin Computation" command from control circuitry 30 via command path 80, computation circuitry 50 uses algorithms disclosed in U.S. Pat. No. 6,037,777 to combine these 3n quantities numerically to evaluate 2n elements of an equivalent circuit representation of the cell/battery. Computation circuitry 50 then calculates the relative charge (SOC) and/or the absolute charge (Ah) of the cell/battery from values of particular elements of this circuit representation. Finally, computation circuitry 50 outputs the computed result to the user on display 90 and/or uses the result to control a process 100 such as a battery charger.

In practice, a microprocessor or microcontroller running an appropriate software program can perform the functions of both control circuitry 30 and computation circuitry 50.

Figure 2:
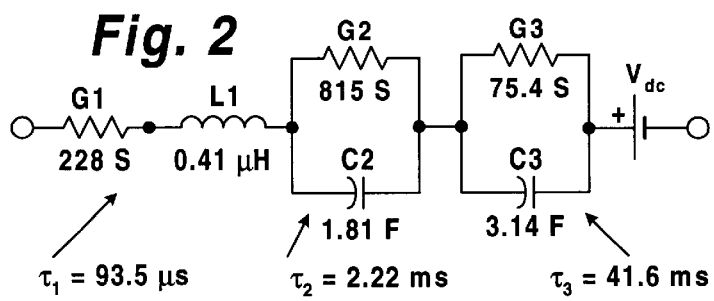
FIG. 2 depicts a six-element small signal equivalent circuit representation of a particular automotive storage battery.

FIG. 2 discloses a six-element equivalent circuit representation of a typical automotive storage battery. This circuit representation was evaluated using apparatus of the type disclosed in FIG. 1 with n=3 by employing algorithms disclosed in U.S. Pat. No. 6,037,777. The three measurement frequencies were 5 Hz, 70 Hz, and 1000 Hz. One notes that the n=3 equivalent circuit comprises three subcircuits:

A series G1-L1 subcircuit.
A parallel G2-C2 subcircuit.
A parallel G3-C3 subcircuit.

One notes further that the three subcircuits are characterized by having very different time constants. The shortest time constant, $\tau_1 = L1 \cdot G1 = 93.5$ μS, belongs to the series G1-L1 subcircuit. The next longest time constant, $\tau_2 = C2/G2 = 2.22$ mS, belongs to the parallel G2-C2 subcircuit; and the longest time-constant, $\Sigma_3 = C3/G3 = 41.6$ mS, belongs to the parallel G3-C3 subcircuit. Accordingly, the three subcircuits represent quite different physical processes and can be differentiated from one another by their time constants.

Figure 3:
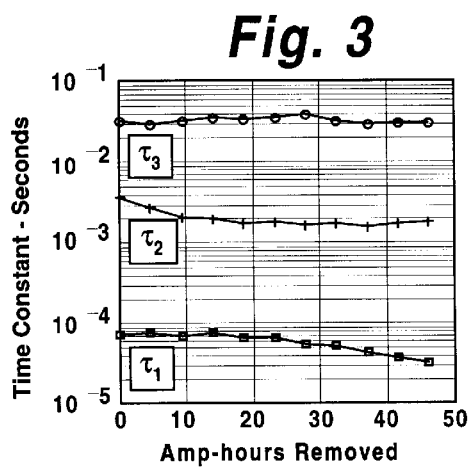
FIG. 3 is a plot of the variation of the three subcircuit time-constants defined in FIG. 2 as functions of the charge removed from the battery.

FIG. 3 is a logarithmic plot of the three time constants defined above as functions of charge (ampere-hours) removed from the battery. One notes that the three time constants remain widely separated as charge is removed, and that the longest of the three, $\tau_3$, is nearly independent of state-of-charge.

Figure 4:
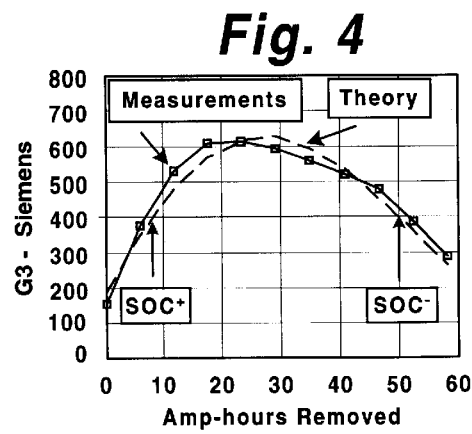
FIG. 4 is a plot of measured and theoretical values of conductance G3 defined in FIG. 2 as functions of the charge removed from the battery.

FIG. 4 discloses the variation of conductance G3 with charge (amp-hours) removed from the battery. One sees that G3 approaches minimum near full charge and again near full discharge, while reaching maximum at about 50% state-of-charge. This variation is consistent with a theoretical model that associates the G3-C3 subcircuit with a linearized, small-signal, representation of the nonlinear electrochemical reaction occurring at the negative plates. For such a model, conductance G3 would be proportional to both the number of reaction sites available for the charge reaction (i.e., $PBSO_4$ sites) and also the number of sites available for the discharge reaction (i.e., Pb sites). Accordingly, G3 would be proportional to the product (SOC)·(1−SOC). FIG. 4 shows a theoretical curve based upon this assumption. The agreement between the theoretical curve and the experimental points is seen to be excellent.

The observed variation of G3 with SOC can be exploited to determine SOC from measurements of G3. Inverting the theoretical G3(SOC) curve leads to a quadratic equation for SOC(G3). This quadratic equation has two roots, identified as $SOC^+$ and $SOC^-$ for G3=400 S in FIG. 4. The $SOC^+$ root in FIG. 4 corresponds to approximately 85% SOC and the $SOC^-$ root corresponds to about 15% SOC. Thus, if one knows which root is the correct root, one can determine SOC from measurements of G3. Introducing a single piece of auxiliary information such as battery voltage, single-frequency conductance, or the value of one of the other elements of the equivalent circuit can readily identify the correct root.

Figure 5:
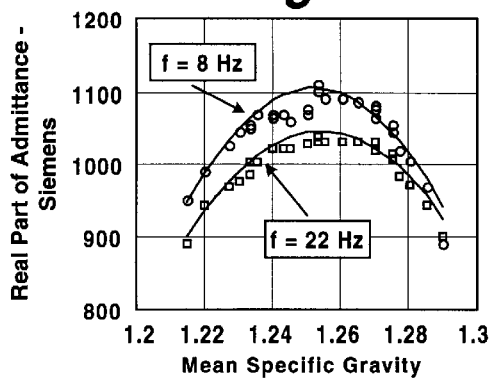
FIG. 5 is a plot of the conductance, or real part of the admittance, of an automotive battery measured at both 22 Hz and 8 Hz as functions of the mean specific gravity of the battery.

FIG. 5 discloses plots of measurements of conductance, i.e. the real part of the complex admittance, obtained at two different frequencies—8 Hz and 22 Hz. These results were obtained by sequentially discharging a battery while measuring the conductance and the specific gravity after each discharge. The data are plotted as functions of the battery electrolyte's mean specific gravity. Although the effect is not as pronounced, one notes the same type of behavior at both frequencies as was noted above with reference to FIG. 4. That is, the measured conductance is smallest at both full charge and at full discharge, and reaches maximum near 50% SOC. This suggests that if accuracy is not too important, one may be able to determine an approximation to SOC from a simple analysis of measurements of conductance alone obtained at one or more appropriately chosen frequencies. Such an analysis would be much simpler than the rigorous mathematical analysis disclosed in U.S. Pat. No. 6,037,777 and would take advantage of the fact, disclosed above in FIG.3, that the time constants of the subcircuits are widely separated so that the subcircuits have little interaction.

Figure 6:
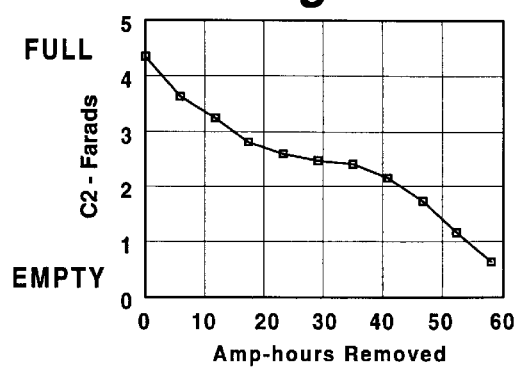
FIG. 6 is plot of measured values of capacitance C2 defined in FIG. 2 as a function of the charge removed from the battery.

FIG. 6 discloses a plot of measured values of capacitance C2 as a function of charge (amp-hours) removed from the battery. Note that this capacitance is observed to decrease monotonically with charge removed. I have found the value of capacitance C2 to be an excellent indicator of the absolute charge (Ah) contained in the battery. As such, its measurement could be used to implement a battery "fuel gauge". To illustrate this possibility, "EMPTY" and "FULL" indications have been added to the plot of FIG. 6. Although the relationship between C2 and remaining charge is not exactly a linear relationship, it appears to be fairly close to linear. One notes that, after all, many automobile fuel gauges are not exactly linear either.

Figure 7:
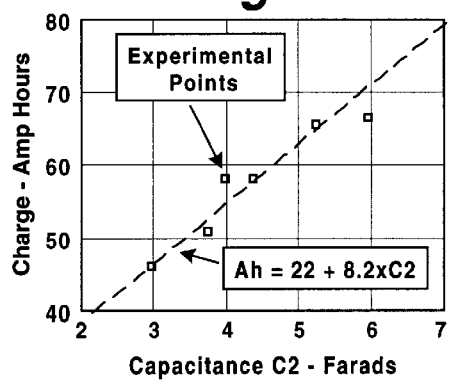
FIG. 7 is a plot showing experimental and theoretical values of the amp-hour capacity of six fully-charged batteries as functions of the value of capacitance C2 defined in FIG. 2.

FIG. 7 discloses the total absolute charge in amp-hours as a function of measured capacitance C2 for six fully-charged batteries of varying sizes. The experimental amp-hour points plotted for each battery were obtained from actual timed discharge tests obtained with a constant discharge current of 25 amperes, to a final terminal voltage of 10.5 volts. Also plotted in FIG. 7 is an experimental linear equation of the form Ah=22+8.2·C2. One notes that the experimental points agree with the linear equation within approximately ±3 ampere-hours. This interesting result implies that the absolute charge capacity in ampere-hours can be quite accurately determined from measurements of C2—without the necessity of performing costly and time-consuming timed-discharge tests.

Figure 8:
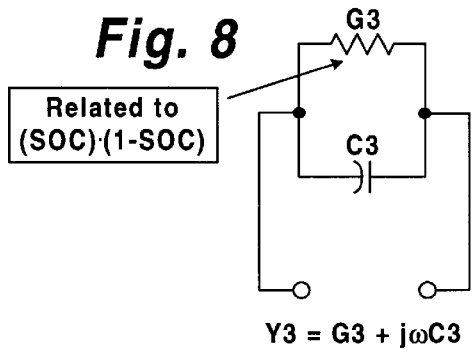
FIG. 8 is a circuit representation of the parallel G3-C3 subcircuit showing its admittance Y3.
Figure 9:
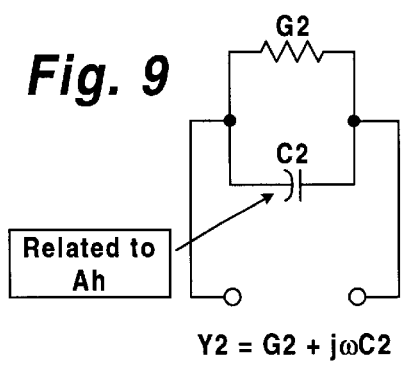
FIG. 9 is a circuit representation of the parallel G2-C2 subcircuit showing its admittance Y2.

FIGS. 8 and 9 illustrate the aspects of the invention. FIG. 8 illustrates the G3-C3 subcircuit and shows that the complex admittance of this parallel subcircuit is Y3=G3+jωC3. Thus, my discussion above actually discloses a relationship existing between the real part of Y3 and the SOC of the battery. Similarly, FIG. 9 illustrates the G2-C2 subcircuit and shows that its complex admittance is Y2=G2+jωC2. Thus, my discussion above actually discloses a relationship existing between absolute charge (Ah) and the imaginary part of Y2 at a particular frequency ω. Although it is true that complex Z and complex Y are reciprocals of one another, the same is not true of their real parts (R,G) or their imaginary parts (X,B). Accordingly, the results of any ac measurement must be expressed in complex admittance form—not complex impedance form—in order to observe the important relationships that I have disclosed herein.

This fundamental result sets my work apart from the prior-art work of those sited above. Previous workers Dowgiallo (in U.S. Pat. No. 3,984,762), Randin et al. (in U.S. Pat. No. 4,743,855), Bounaga (in U.S. Pat. No. 5,650,937), Basell et al. (in U.S. Pat. No. 5,717,336), Sharaf (in U.S. Pat. No. 3,808,522), Yang (in U.S. Pat. No. 5,126,675), Muramatsu (in U.S. Pat. No. 4,678,998), and Fang (in U.S. Pat. No. 5,241,275) have all attempted to derive either SOC or Ah information from the magnitude of the complex impedance, or from components of complex impedance measured at one or more frequency. However, none of these workers has suggested that the real or imaginary parts of a complex admittance were of any interest at all.

Although my disclosure has relied upon particular apparatus and algorithms previously disclosed in U.S. patent applications Ser. No. 09/152,219 and Ser. No. 09/151,324, other methods will be apparent to one skilled in the arts. For example, one can employ bridges or other types of apparatus to measure complex admittance or impedance. Furthermore, if accuracy is not a strict requirement, one can take advantage of the fact that the various time constants are widely separated from one another and simply assume that the subcircuits are not coupled. Within this approximation, C2 and C3 are treated as short circuits at frequencies near $f_{01}=\frac{1}{2}\pi\tau_1$, L1 and C3 are treated as short circuits at frequencies near $f_{02}=\frac{1}{2}\pi\tau_2$, and at frequencies near $f_{03}=\frac{1}{2}\pi\tau_3$, L1 are treated as a short circuit while C2 is treated as an open circuit. Thus, with some batteries, it is possible to obtain satisfactory results with a very simple analysis of measurements at two or three frequencies. With certain batteries, it is even possible to obtain useful approximations to C2 or G3 from measurements of complex Y or Z=1/Y obtained at a single, appropriately chosen, frequency. Workers skilled in the art will recognize that these and other variations may be made in form and detail without departing from the true spirit and scope of my invention.

What is claimed is:

1. Apparatus for determining state-of-charge of an electrochemical cell or battery comprising:

electrical excitation circuitry adapted to apply time-varying electrical excitation to said cell or battery;

response sensing circuitry configured to sense time-varying electrical response of said cell or battery generated as a result of said time-varying electrical excitation; and computation circuitry responsive to said time-varying excitation and to said time-varying response and adapted to calculate the value of the real part of the complex admittance of a particular parallel subcircuit comprising part of an electrical circuit representation of said cell or battery, said real part characterized by varying with state-of-charge and reaching maximum value at approximately 50% state-of-charge, said computation circuitry further adapted to evaluate said state-of-charge from the computed value of said real part of said complex admittance.

2. The apparatus of claim 1 including display circuitry and wherein the computation circuitry provides the computed value of said state-of-charge to the display.

3. The apparatus of claim 1 wherein said computation circuitry couples to an external process device and said external process device is controlled by said computation circuitry in accordance with the computed value of said state-of-charge.

4. The apparatus of claim 1 wherein said electrical circuit representation comprises at least three subcircuits having differing time constants and the time constant of said particular parallel subcircuit is longer than the time constants of at least two other subcircuits.

5. The apparatus of claim 1 wherein said electrical circuit representation comprises at least two subcircuits having different time constants and the time constant of said particular parallel subcircuit is longer than the time constant of at least one other subcircuit.

6. The apparatus of claim 1 wherein said computation means employs auxiliary data to differentiate between two alternative computed values of said state-of-charge.

7. Apparatus for determining the absolute charge contained in an electrochemical cell or battery comprising:

electrical excitation circuitry adapted to apply time-varying electrical excitation to said cell or battery;

response sensing circuitry configured to sense time-varying electrical response of said cell or battery generated as a result of said time-varying electrical excitation; and computation circuitry responsive to said time-varying excitation and to said time-varying response and adapted to compute the value of a capacitive element contained in a particular parallel subcircuit comprising part of an electrical circuit representation of said cell or battery, said computation circuitry further adapted to evaluate said absolute charge from said computed value of said capacitive element.

8. The apparatus of claim 7 including a display device coupled to said computation circuitry and wherein the computation circuitry provides said evaluated absolute charge.

9. The apparatus of claim 8 wherein said display device comprises a battery fuel gauge.

10. The apparatus of claim 7 wherein said computation circuitry couples to an external process device and said external process device is controlled by said computation circuitry in accordance with the computed value of said absolute charge.

11. The apparatus of claim 7 wherein said electrical circuit representation comprises at least three subcircuits having different time constants and the time constant of said particular parallel subcircuit is neither the longest nor the shortest said time constant.

12. The apparatus of claim 7 wherein said electrical circuit representation comprises at least two subcircuits having different time constants and the time constant of said particular parallel subcircuit is longer than the time constant of at least one other subcircuits.

13. A method for determining the state-of-charge of an electrochemical cell or battery comprising:
   applying time-varying electrical excitation to said cell or battery;
   sensing time-varying electrical response to said electrical excitation;
   evaluating the real part of admittance of a particular parallel G-C subcircuit of an equivalent circuit representation of said cell or battery from said time-varying electrical excitation and said time-varying electrical response; and,
   determining said state-of-charge from said real part of admittance of said G-C subcircuit.

14. A method as in claim 13 wherein determining the state-of-charge from said real part of admittance includes using auxiliary data to select one value from two alternative values of said state-of-charge determined from said real part of admittance.

15. A method as in claim 14 including displaying said selected one value of said state-of-charge.

16. A method as in claim 14 including controlling an external process device in accordance with said selected one value of said state-of-charge.

17. A method for determining the value of the absolute charge contained in an electrochemical cell or battery comprising:
   applying time-varying electrical excitation to said cell or battery;
   sensing time-varying electrical response to said electrical excitation;
   evaluating the capacitance of a capacitive element of a particular parallel G-C subcircuit of an equivalent circuit representation of said cell or battery from said time-varying electrical excitation and said time-varying electrical response; and,
   evaluating said absolute charge from the value of said capacitive element.

18. The method of claim 17 including displaying said evaluated absolute charge to a user.

19. The method of claim 17 including controlling an external process device in accordance with said evaluated absolute charge.

* * * * *